United States Patent [19]

Grabbe

[11] Patent Number: 4,995,816
[45] Date of Patent: Feb. 26, 1991

[54] PIVOTAL ELECTRICAL CONTACT
[75] Inventor: Dimitry G. Grabbe, Middletown, Pa.
[73] Assignee: AMP Incorporated, Harrisburg, Pa.
[21] Appl. No.: 414,561
[22] Filed: Sep. 29, 1989
[51] Int. Cl.⁵ .......................................... H01R 23/72
[52] U.S. Cl. .................................. 439/71; 439/68; 439/82
[58] Field of Search .................... 439/68, 71, 81–83, 439/264, 265, 817, 876

[56] References Cited
U.S. PATENT DOCUMENTS

| | | | |
|---|---|---|---|
| 4,354,729 | 10/1982 | Grabbe et al. | 439/71 |
| 4,504,887 | 3/1985 | Bakermans et al. | 439/71 |
| 4,513,353 | 4/1985 | Bakermans et al. | 439/71 |
| 4,684,184 | 8/1987 | Grabbe et al. | 439/68 |
| 4,906,194 | 3/1990 | Grabbe | 439/71 |
| 4,927,369 | 5/1990 | Grabbe et al. | 439/82 |

Primary Examiner—Paula A. Bradley
Attorney, Agent, or Firm—James M. Trygg

[57] ABSTRACT

An electrical contact (100) formed as a monolithic element includes a cantilevered member (74), first and second contact portions (68 and 70), a C-shaped spring member (80), and a base (72). Three pivotal zones (79, 84, and 102) are provided so that a relatively large deflection of the first contact portion (68) is transformed into a small deflection at the point where the spring action is effective so that a relatively flat force/deflection characteristic is attained. A kinematic model and five embodiments of the contact are disclosed, as well as a method of formation thereof.

11 Claims, 6 Drawing Sheets

PIVOTAL ELECTRICAL CONTACT

BACKGROUND OF THE INVENTION

This invention relates to connector assemblies for integrated circuit chips and, more particularly, to an improved electrical contact for use therein.

When designing connector assemblies for use with integrated circuit chips, different requirements for the contact element, which provides an electrical path between the chip and a printed circuit board on which the connector assembly is mounted, must be met. One requirement is that the portion of the contact which interfaces with the chip carrier be able to sustain a relatively large deflection in order to accommodate manufacturing dimensional variations or tolerances between individual chip packages. Such packages may contain a single IC chip or a number of them forming a subassembly. It is not unusual, at the present time, to have a variation of as much as 0.030 inch between the minimum and maximum dimensions of component chip packages from different manufacturers. At the same time, the contact force over that range must remain within acceptable limits. Thus, a relatively flat force/deflection curve is desirable. By way of example, in the case when the electrical contact is tin plated, the contact force should be approximately 220 grams for the minimum deflection of the contact and approximately 400 grams for the maximum deflection of the contact. This imposes certain requirements on the spring which generates the contact force. However, the space in which a spring of such compliance is to be designed must be small for a number of reasons. A first reason is that the high cost of material requires economy of size. A second reason is that electrical requirements dictate a short electrical path to minimize self-inductance in the contact.

Opposing these requirements is the known physical effect that a large deflection of metal usually results in a permanent, or plastic, deformation of the metal. If, however, a straight beam, by way of example, is to be deflected the required distance and stay within its elastic limit (i.e., a deformation magnitude within which the part will totally recover to its original position after removal of the deforming force) such a beam would have to be relatively long and would not satisfy the electrical length or space requirements.

It is therefore a primary object of this invention to provide a contact of the type described wherein a relatively short beam is deflected and the relatively large deflection of that short beam is changed into a relatively small deflection of a spring thereby permitting the spring to stay within its elastic limit.

It is another object of this invention to provide such a contact as a monolithic element.

SUMMARY OF THE INVENTION

The foregoing and additional objects are attained in accordance with the principles of this invention by making an electrical contact using the steps of first forming from a planar metal sheet a monolithic planar blank having a base, a terminal projecting therefrom and a cantilevered member having first and second ends with a pivotal zone therebetween, wherein the first end projects from the base. A spring member having third and fourth ends, the third end projecting from the second end of the cantilevered member through a pivotal zone, is formed as a single coplanar piece with the base and cantilevered member. The fourth end is pivotally associated with the base, at a point adjacent the first end, by means of a third pivotal zone. In the case when the fourth end is a free end with respect to the base, the free end is latched into a pivotal socket formed in the base which preloads the cantilevered member in a direction away from the spring member. In the case where the fourth end is integral with the base, the spring member is deformed in a direction to preload the cantilevered member away from the spring member.

These steps result in the formation of an electrical contact for providing an electrical path between a contacting surface of a mating electrical component and a terminal of the connector.

In accordance with an aspect of the invention, the contact is formed as a monolithic element from a planar metal sheet.

In accordance with another aspect of this invention, the cantilevered member is cantilevered from the base at its first end and the compliance of the metal forming the contact allows pivoting movement of the cantilevered member relative to the base.

DETAILED DESCRIPTION

Figure 1:
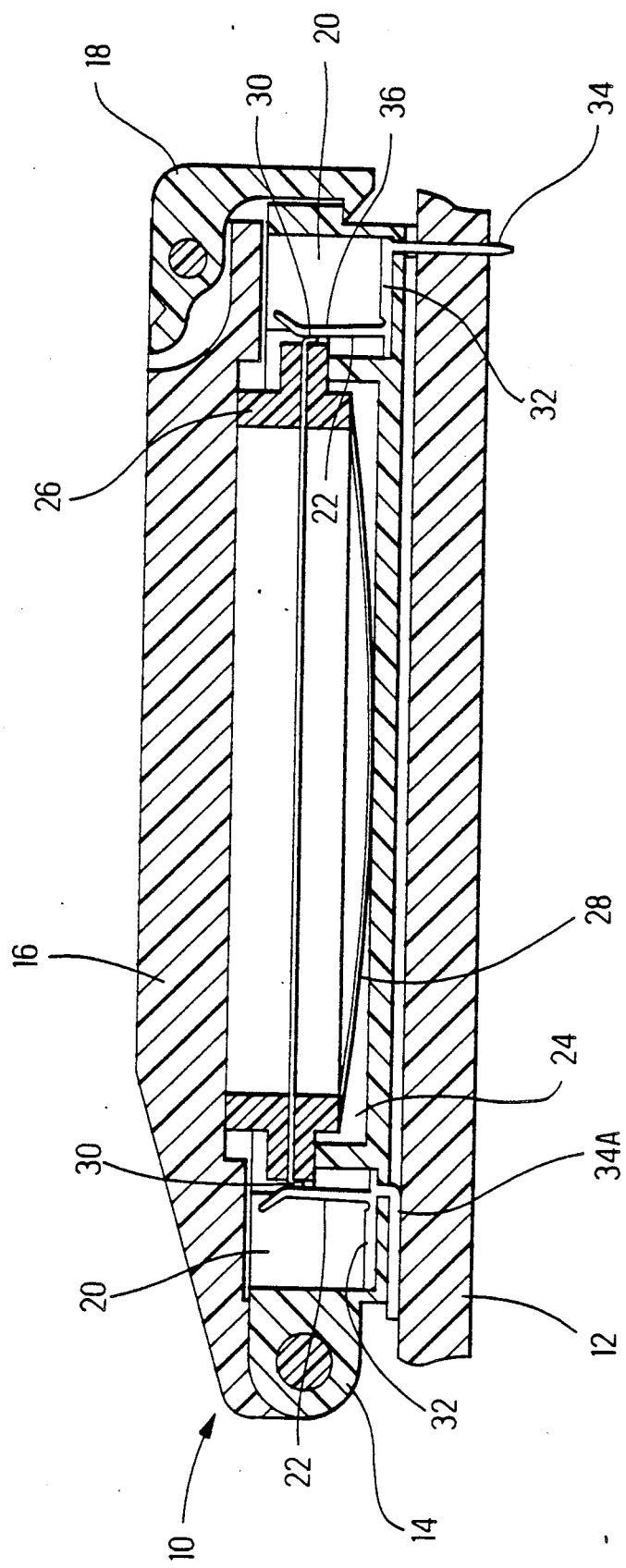
FIG. 1 is a cross-sectional view through an illustrative connector assembly in which an electrical contact constructed in accordance with the principles of this invention may be utilized.

FIG. 1 shows a connector assembly, designated generally by the reference numeral 10, mounted on a printed circuit board 12 and in which a contact according to this invention may be utilized. The connector assembly 10 is of the type utilized for burn-in or testing of an integrated circuit chip or a multi-chip subassembly and includes, generally, a body portion 14, a hinged cover member 16, and a latch member 18 for releasably securing the cover member 16 to the body portion 14 in a closed position. The body portion 14 is formed with a plurality of cavities 20, each for holding a single electrical contact, schematically shown at 22. The cavities 20 are arranged around the periphery of a central pocket 24, sized to accept the integrated circuit chip package 26. Within the bottom of the pocket 24 there is disposed a spring member 28 which is utilized to spring load the package 26 so that upon opening of the cover member 16, the package 26 is partially ejected.

The package 26 is formed with terminals, leads, or pads along its periphery, illustratively depicted at 30. These terminals 30 are adapted for contact with respective ones of the contacts 22 disposed in the cavities 20. As schematically shown in FIG. 1, each of the contacts 22 has a base portion 32 from which a downwardly depending contact leg, or terminal 34 extends for insertion into an appropriately sized and spaced opening through the printed circuit board 12, as is conventional in the art. Alternatively, the terminal 34 may be configured for surface mounting, in a conventional manner, as shown in FIG. 1 at 34A. A contact arm 36 extends upwardly from the base portion 32 for surface contact with the package terminal 30 upon insertion of the package 26 into the pocket 24. One of the requirements for the contact 22 is that the contact arm 36 exerts a contact force against the package terminal 30. If all elements could be made perfectly, and there were no variations in the size of the package 26, then this contact force could be generated by the inherent resiliency of the contact arm 36 cantilevered on the base portion 32. However, in the real world, there are manufacturing tolerances for the package 26 which vary from manufacturer to manufacturer. The contact arm 36 must be capable of accommodating these tolerances, which may be on the order of 0.030 inch from the largest to the smallest size package, while still exerting an appropriate contact force. If the contact arm 36 was constructed as a simple beam as shown in FIG. 1, the large deflection from the largest size package 26 would deform the contact arm 36 beyond its elastic limits so that when a smaller package 26 was inserted in the pocket 24, the contact arm 36 could not spring back to apply the required contact force. If size were not at a premium, then the contact arm 36 could be lengthened. However, as previously described, size is limited. Thus, a contact 22 must be designed which is small in size and capable of accommodating the relatively large deflection noted above while still retaining its effective resiliency so that an appropriate contact force is generated over the entire range of package sizes.

Figure 2:
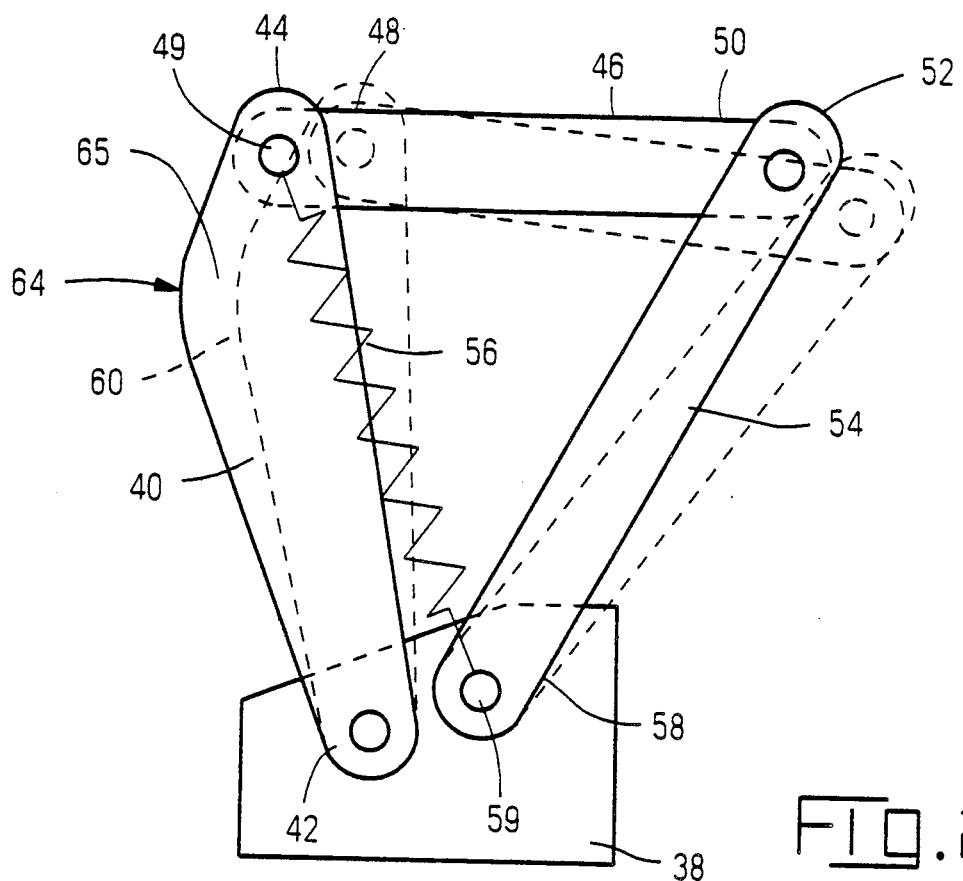
FIG. 2 is a kinematic model of a design for a contact embodying the principles of this invention.

FIG. 2 illustrates a kinematic model of a contact which transforms a large deflection of a short beam to a very small deflection at another location where a spring is acting, permitting the spring to stay within its elastic limit. The model includes a base 38 and a first beam 40 having a first end 42 and a second end 44. The first end 42 of the first beam 40 is attached to the base 38 for pivoting movement. A second beam 46 has a first end 48 pivotally attached to the first beam second end 44 at the pivot 49 and extends outwardly. The second beam second end 50 has pivotally attached thereto a first end 52 of a third beam 54 having a second end 58 pivotally attached to the base 38 at the pivot 59 as shown. A spring 56 resiliently couples the first beam second end 44 to the third beam second end 58. If a force is applied to the beam 40, as indicated by the arrow 64, this force being equivalent to the force exerted on the contact arm 36 by the package terminal 30 (FIG. 1), the beam 40 will be pivoted clockwise about its first end 42 to the position shown by the broken lines 60. This will cause the pivot point 59 at the third beam second end 58 to also pivot clockwise so that the distance between the pivot points 49 and 59 of the ends 44 and 58 respectively becomes slightly smaller by a fraction of the horizontal displacement of the first beam second end 44. Movement from the equilibrium position shown by the solid lines in FIG. 2 to the position shown by the broken lines will be resisted by the spring 56. In effect, the spring 56 resiliently couples the area 65, where the force 64 is applied, to the base 38 so as to generate the desired contact force. When the force indicated by the arrow 64 is removed, the mechanism shown in FIG. 2 will return from the displaced position shown by the broken lines 60 to the equilibrium position shown by the solid lines.

From studying the mechanism shown in FIG. 2, it will be appreciated that the relatively large deflection of the beam 40 imposes a small change in the distance between the pivot points of the ends 44 and 58 which can then be conventionally acted upon by the spring 56, and the spring 56 may have a very steep force/deflection curve, while the composite spring rate tending to return the beam 40 to its equilibrium position will be relatively flat.

Figure 3:
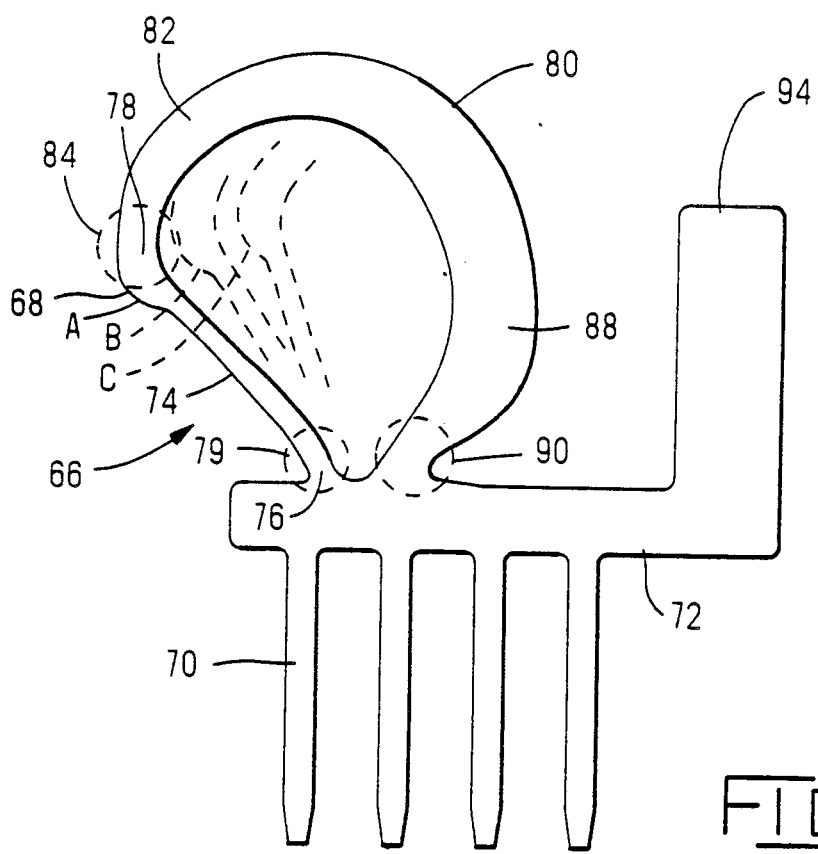
FIG. 3 is a first illustrative form of an electrical contact constructed in accordance with the principles of this invention.

As previously described, the size of the cavity 20 is limited. In some cases, the cavity may be 0.150 inch by 0.220 inch and must accommodate a contact having a thickness of 0.010 inch. It is apparent that a mechanism of the complexity shown in FIG. 2 cannot, at this time, be constructed with any practical technology to satisfy those size constraints. However, in accordance with the principles of this invention, there can be constructed from a monolithic piece of metal a direct analog of the mechanism shown in FIG. 2. A first illustrative form of such an electrical contact, designated generally by the reference numeral 66, is depicted in FIG. 3.

The contact 66 is formed as a monolithic element from a planar metal sheet. It provides an electrical path between a first contact portion 68 and a second contact portion 70 as well as a contact force at the first contact portion 68, directed toward the left as viewed in FIG. 3. The contact element 66 includes a base portion 72, from which the second contact portion 70 extends. A cantilevered member 74 has a first end 76 and a second end 78, the first end extending from the base portion 72 in a cantilevered fashion. The first contact portion 68 is formed as part of the member 74 adjacent the second end 78. A first pivotal zone 79 is provided in the area where the end 76 extends from the base 72. This pivotal zone permits first elastic movement and then deformation within the pivotal zone 79 so that the member 74 can undergo pivotal movement. A generally C-shaped or other suitably shaped spring member 80 has a first end 82 pivotally associated, by means of a second pivotal zone 84 with the second end 78 of the cantilevered member 74, and a second end 88 pivotally associated, by means of a third pivotal zone 90 with the base 72. The contact 80 is formed by blanking out of a piece of flat sheet stock wherein the first contact portion 68 is in the position indicated by broken lines at B of FIG. 3. A force is applied to the C-shaped spring member 80 to skew it to the left relative to the base 72 to create an overstress condition in the member 80 so that it takes a set. With the force removed and the member 80 in equilibrium, the first contact portion 68 will now be in the position indicated by solid lines at A in FIG. 3. Note that the skewing of the C-shaped spring member 80 to the left causes the member 74 to be preloaded, within its elastic limit, to the left. This effectively increases the operating range of deflection of the member 74 from the preloaded position A through the unloaded position B to a position C where the member 74 is at its maximum deflection to the right, as viewed in FIG. 3, without taking a set. An overstress stop 94 projecting upwardly from the base 72 limits movement of the contact 66.

Figure 4:
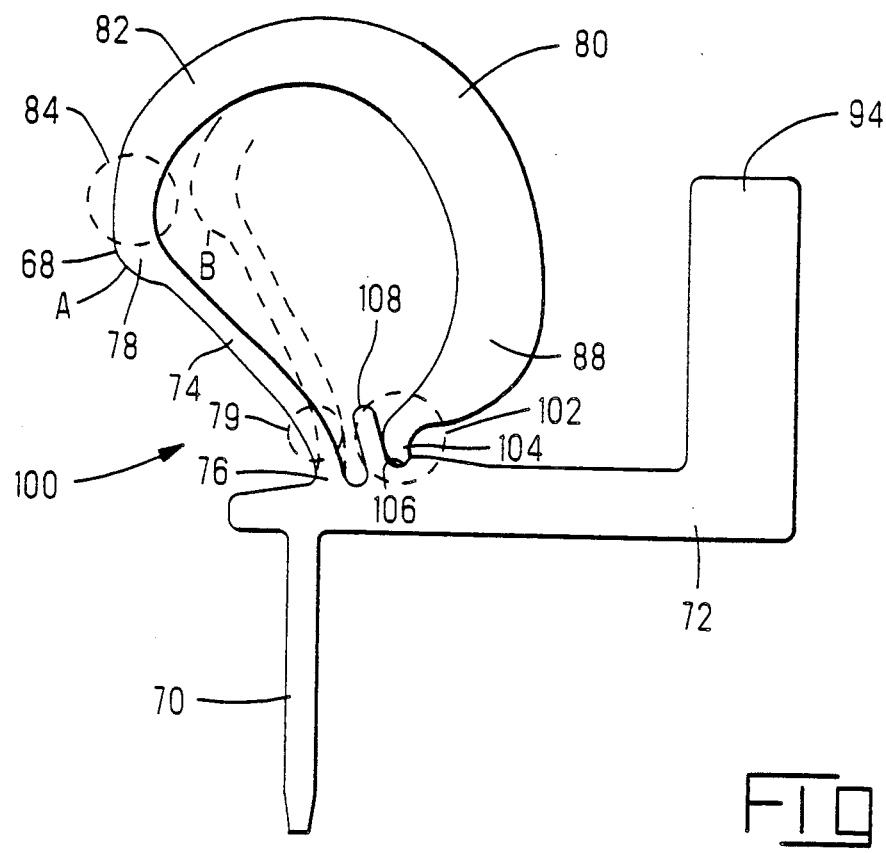
FIGS. 4 and 5 show preferred forms of an electrical contact constructed in accordance with the principles of this invention.

A preferred embodiment of the contact 66, is shown in FIG. 4 and indicated as 100. Similar elements of the two contacts 66 and 100 are indicated by similar designator numerals and will not be described again here. As is shown in FIG. 4, the contact 100 is substantially identical with the contact 66 in all respects except for the pivotal zone 90. The contact 100 includes a pivotal zone 102 which instead of utilizing plastic deformation of the metal to permit pivotal movement of the end 88, a two piece pivotal nesting structure is used. The portion 104 of this nesting structure, which is attached to the end 88, is a free end which pivotally engages a nest 106 disposed in the base 72. When the contact 100 is deflected to the right, as seen in FIG. 4, and the first contact portion 68 is moved from the position A to the position B, the portion 104 will undergo pivotal movement within the nest 106.

Figure 4A:
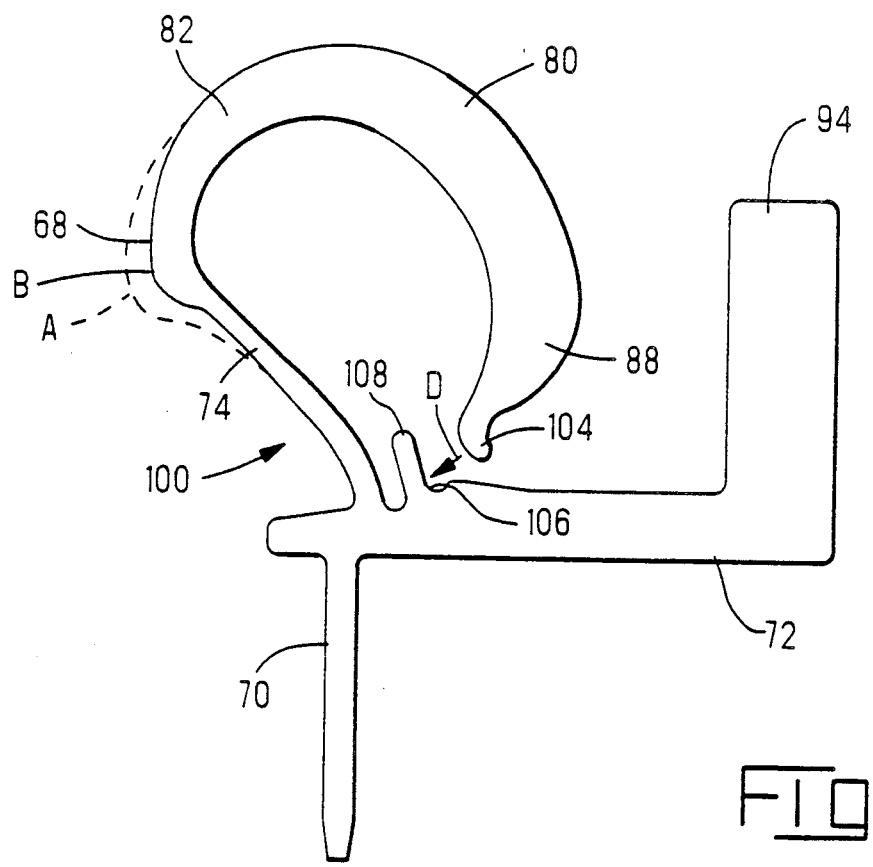
FIGS. 4A and 5A illustrate steps in the formation of the contacts shown in FIGS. 4 and 5.

This first embodiment of the contact is shown in FIG. 4A as it would appear after blanking from sheet stock. The portion 104 is then urged to the left, as indicated by the arrow D in FIG. 4A, into contact with a backing member 108 and into latching engagement with the nest 106. This movement to the left of the portion 104 causes the C-shaped member 80 to preload the cantilevered member 74 by moving the first contact portion 68 to the left to the position A, similar to the preloading of the member 74 of the contact 66. The backing member 108 serves to aid in the latching of the portion 104 to the nest 106.

Figure 5:
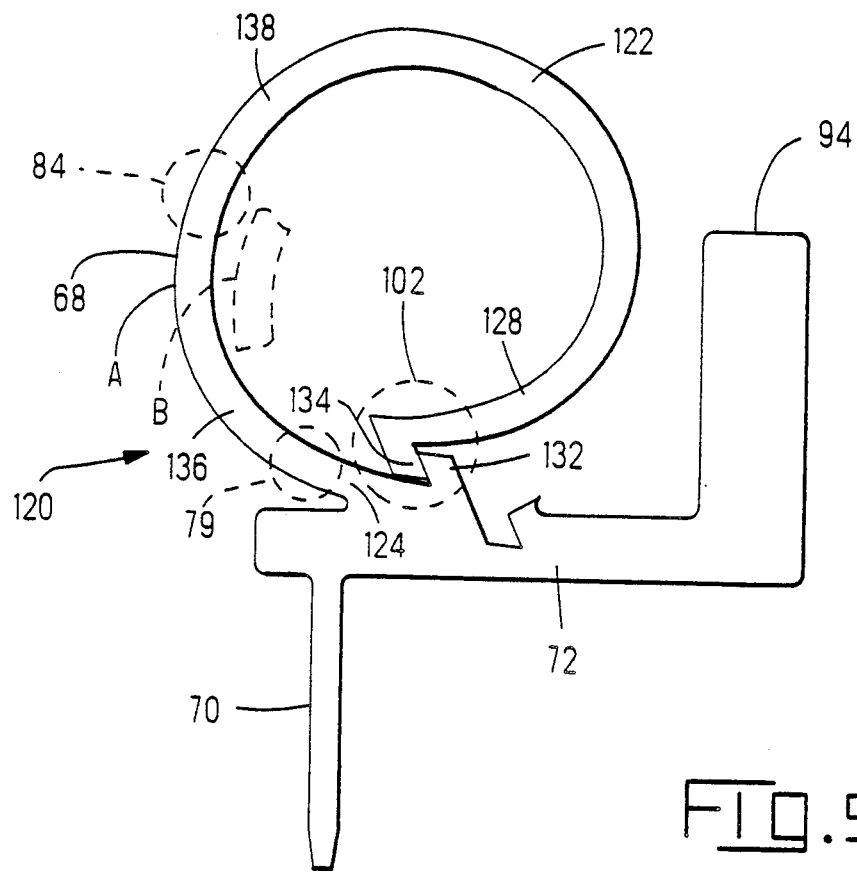
Figure 5A:
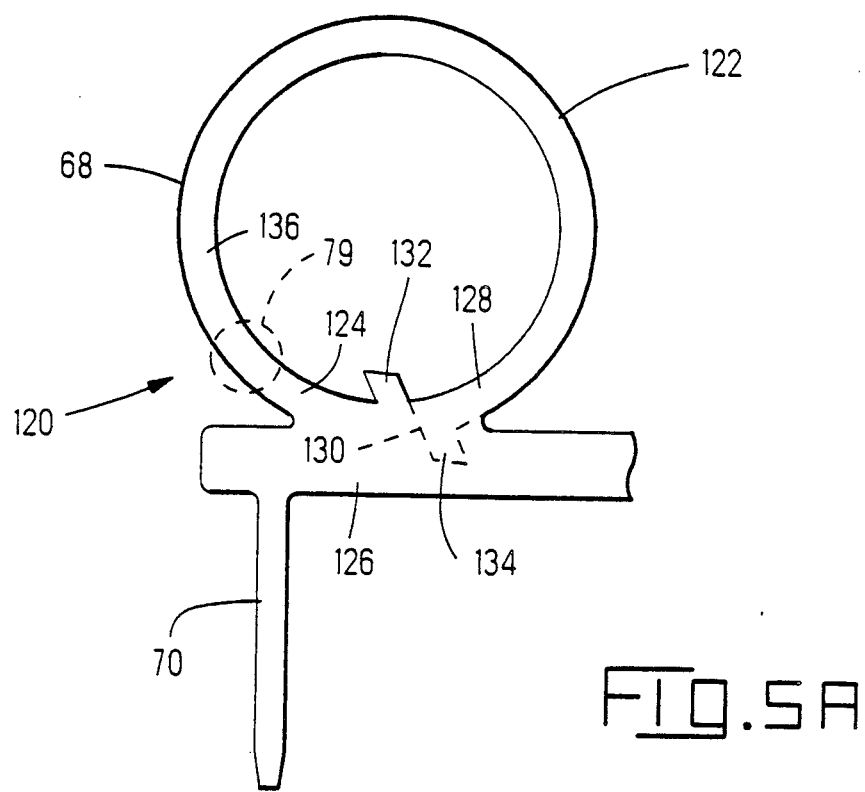

A second embodiment of the inventive contact, indicated as 120, is shown in FIGS. 5 and 5A. A substantially circular spring member 122 has a first end 124 extending from a base 126 and a second end 128 which will be severed from the base along the broken lines 130 as a second manufacturing operation as explained below. A first contact portion 68 is disposed on the left most edge of the member 122 similar to the first contact portion 68 of the contacts 66 and 100. A tab 132 projects upwardly from the base 126 toward the interior of the circular spring member 122. The contact 120 is blanked from sheet stock in a manner similar to that of the contact 66 and will appear substantially as shown in FIG. 5. As a second operation, the end 128 is severed from the base 126 along the broken lines 130 to form a latch keeper 134. In doing so, the keeper 134 is forced out of the plane of the base 126, moved to the left and upwardly, and brought back into the plane of the base and latched onto the tab 132, as shown in FIG. 5A. This urges the circular spring member 122 toward the left, as viewed in FIG. 5A, so that the first contact portion 68 is moved from its unloaded position B shown in broken lines to its preloaded position A shown in solid lines. Note that as the portion 68 undergoes movement from position B to position A, the portion 136 behaves similar to the cantilevered member 74 of the contact 100 by undergoing pivotal motion through a pivotal zone 79. Additionally, the portion 138 of the circular spring member 122 undergoes pivotal motion within the pivotal zone 84 in a manner similar to that of the contact 100. Thus, the contact 120, while of a slightly different shape, includes the functional elements of the contact 100 including: the cantilevered member 74,136; the first and second contact portions 68 and 70; a C-shaped spring member 80, (a portion of 122); the pivotal zones 79,84 and 102; and the base 72.

Figure 6:
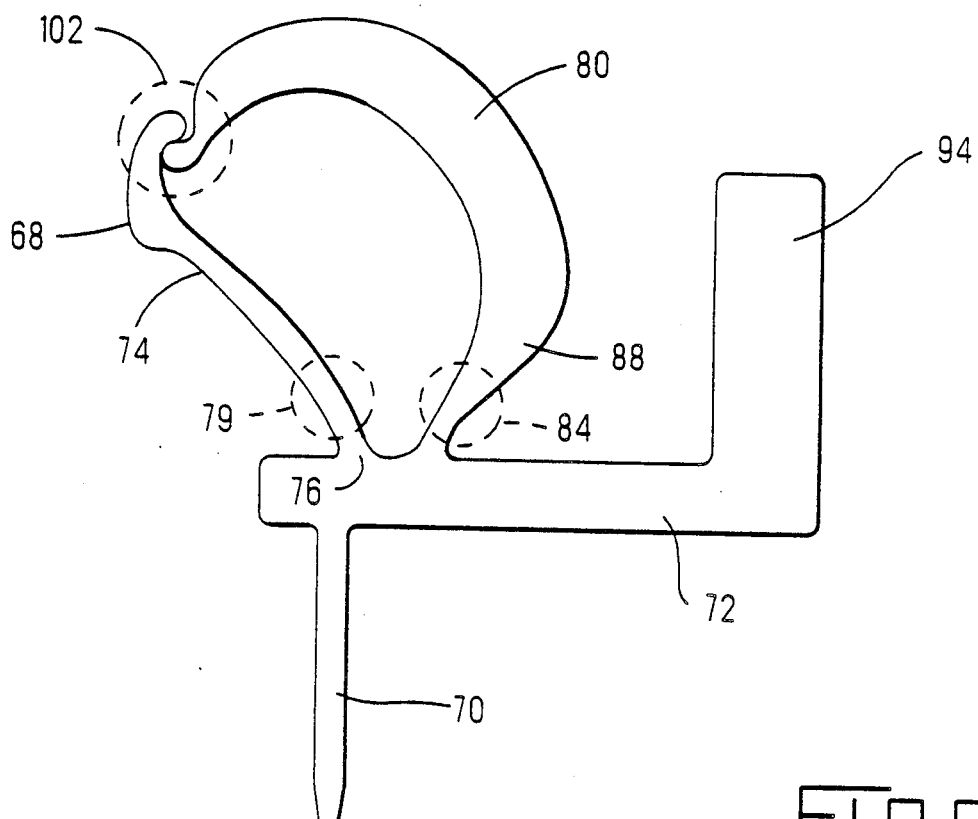
FIGS. 6 and 7 shown variations of the electrical contacts of FIGS. 4 and 5.
Figure 7:
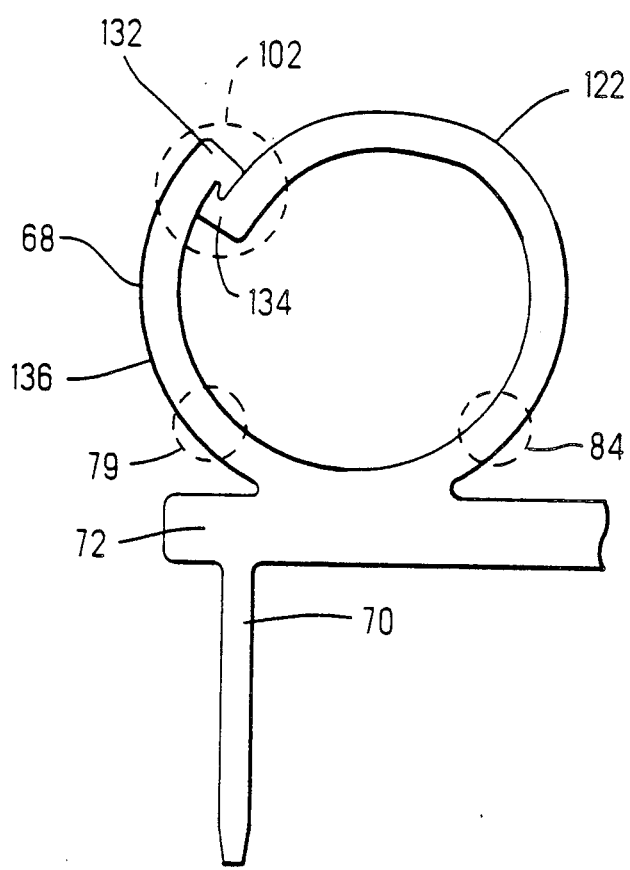

Variations of the contacts 100 and 120 of FIGS. 4 and 5 are shown in FIGS. 6 and 7 respectively. Like elements in these figures have like identifying numerals. As can be seen, the only difference between these respective figures is that the pivotal zones 102 and 84 are reversed.

Figure 8:
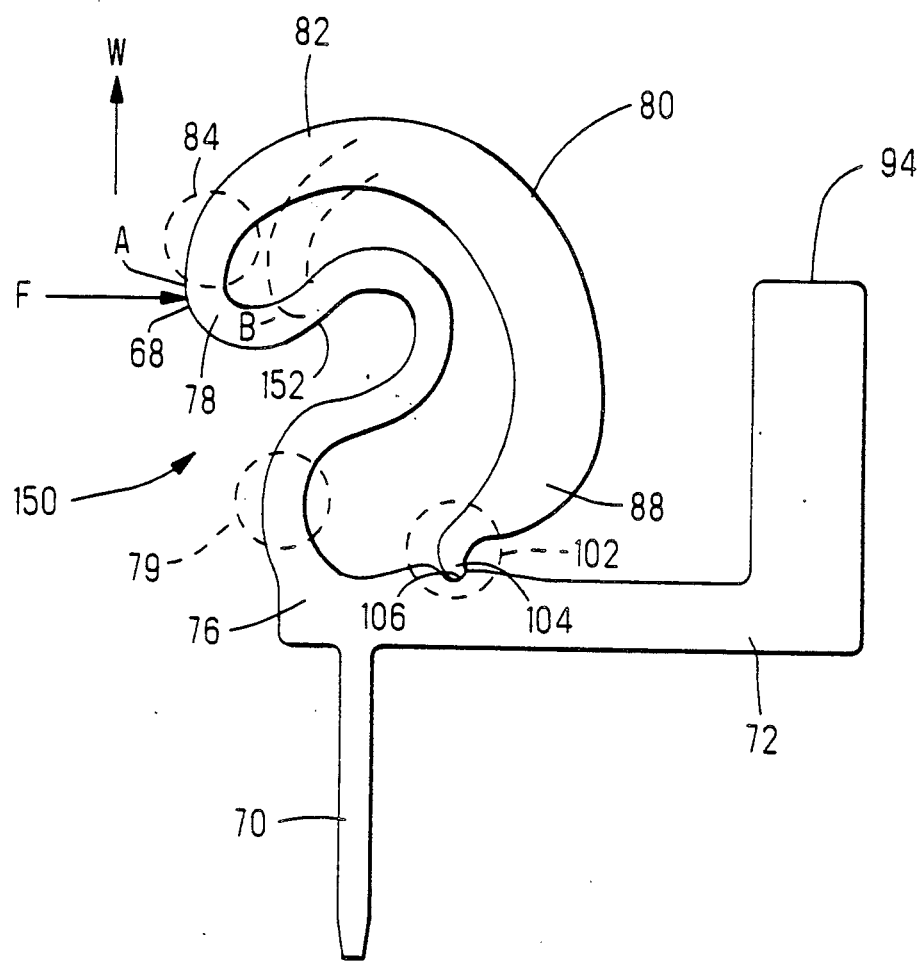
FIG. 8 shows another embodiment of the electrical contact of FIG. 4.

Another variation of the contact 100 is shown in FIG. 8 and identified as 150. The contact 150 is similar to the contact 100 except that the cantilevered member 74 is replaced with a cantilevered serpentine-shaped member 152. The member 152 extends from the base 72 from the end 76, through the pivotal zone 79, through the serpentine shape to the end 78, which is pivotally associated by means of the pivotal zone 84 with the end 82 of the C-shaped spring member 80. The serpentine-shaped member 152 is arranged to resiliently respond to the usual contact engagement force, which would be in the direction of the arrow F as shown in FIG. 8, by urging the first contact portion 68 a slight amount in the direction of the arrow W. In this way, as the first contact portion 68 is brought into contacting engagement with a mating surface, such as the package terminal 30 shown in FIG. 1, the resiliency inherent in the serpentine-shaped member 152 will cause the first contacting portion 68 to wipe the mating surface a slight amount. This wiping action will clean the contacting surface of contaminants and result in a superior electrical connection.

A very important aspect of the present invention is that a relatively large movement of the first contact portion 68 from its free form position represented by A in the figures, to a deflected position such as represented by B in the figures, results in a relatively small decrease in the distance between the two pivotal zones 84 and 102 (or 90). This is characteristic of all of the contacts 66,100,120,150, and the variations shown in FIG. 6 and 7. This decrease in the distance between the two pivotal zones 84 and 102 is resisted by the C-shaped spring member 80,122 which provides the contact pressure urging the first contact portion 68 into pressing engagement with the mating surface 30. Since the C-shaped spring member 80,122 need move only a small amount in response to a relatively large movement of the first contact portion 68, the spring member 80,122 may be a very high compliance structure which will remain within its elastic limit when deflected.

I claim:

1. In a connector for providing an electrical path between a contacting surface of a mating electrical component and a terminal of the connector, an electrical contact comprising:
   (a) a base;
   (b) a terminal projecting from said base;
   (c) a cantilevered member having first and second ends, said first end projecting from said base through a first pivotal zone to said second end;
   (d) a contact associated with said second end of said cantilevered member; and
   (e) a spring member having a third end and a fourth end, said third end being pivotally associated by means of a second pivotal zone with said second end of said cantilevered member and said fourth end being pivotally associated by means of a third pivotal zone with said base at a point adjacent said first end of said cantilevered member, wherein said third and fourth ends are resiliently urged apart thereby causing said cantilevered member to pivot about said first pivotal zone urging said contact into engagement with said contacting surface.

2. The contact according to claim 1 wherein said cantilevered member includes resilient means for causing said contact to wipe against said contacting surface upon engagement therewith.

3. The contact according to claim 1 including integral overstress stop means for limiting the deflection of the contact in a direction opposite to the generated contact force.

4. The contact according to claim 1 wherein one of said third and fourth ends is a free end wherein its respective pivotal zone includes means for receiving and pivotally holding said free end.

5. The contact according to claim 4 wherein said free end is said fourth end.

6. The contact according to claim 4 wherein the material forming said contact within said first pivotal zone is compliant and thereby allows pivoting movement of said cantilevered member relative to said base.

7. The contact according to claim 1 wherein said cantilevered member, said spring member, and said base are substantially coplanar.

8. The contact according to claim 7 wherein said contact is formed as a monolithic element from a planar metal sheet.

9. The contact according to claim 1 wherein said third and fourth ends of said spring member are pivotally associated with said second end of said cantilevered member and said base, respectively, so that as said cantilevered member pivots causing said contact to move a relatively large distance toward or away from said contacting surface, the distance between said third and fourth ends of said spring member correspondingly increases or decreases a relatively small amount.

10. The contact according to claim 9 wherein said spring member remains within its elastic limit as said distance between said third and fourth ends increases or decreases said relatively small amount.

11. The contact according to claim 10 wherein said spring member is arranged to preload said cantilevered member in a direction toward said contacting surface.

* * * * *